United States Patent
Hong et al.

(10) Patent No.: US 10,206,300 B2
(45) Date of Patent: Feb. 12, 2019

(54) PRINTED CIRCUIT BOARD ASSEMBLY AND DISPLAY APPARATUS HAVING THE SAME

(71) Applicant: SAMSUNG DISPLAY CO., LTD., Yongin-si, Gyeonggi-Do (KR)

(72) Inventors: Sungrak Hong, Cheonan-si (KR); Kyomin Kim, Yongin-si (KR); Dohyeon Park, Asan-si (KR); Myoung-ha Jeon, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/621,492

(22) Filed: Jun. 13, 2017

(65) Prior Publication Data

US 2018/0020563 A1    Jan. 18, 2018

(30) Foreign Application Priority Data

Jul. 18, 2016 (KR) .................... 10-2016-0090591

(51) Int. Cl.
| | |
|---|---|
| H05K 1/14 | (2006.01) |
| H05K 7/06 | (2006.01) |
| H05K 1/02 | (2006.01) |
| H05K 1/03 | (2006.01) |
| H05K 1/05 | (2006.01) |
| H05K 1/18 | (2006.01) |
| H05K 5/00 | (2006.01) |
| H05K 5/02 | (2006.01) |

(Continued)

(52) U.S. Cl.
CPC ............ *H05K 7/06* (2013.01); *H05K 1/0296* (2013.01); *H05K 1/0393* (2013.01); *H05K 1/05* (2013.01); *H05K 1/188* (2013.01); *H05K 5/0017* (2013.01); *H05K 5/0247* (2013.01); *H05K 5/03* (2013.01); *H05K 7/1491* (2013.01); *H05K 7/1494* (2013.01); *H05K 7/20954* (2013.01); *H05K 2201/10136* (2013.01)

(58) Field of Classification Search
CPC ...... H05K 1/0296; H05K 1/0393; H05K 1/05; H05K 1/188; H05K 5/0017; H05K 5/0247; H05K 5/03; H05K 7/06; H05K 7/1491; H05K 7/1494
USPC ........................................... 361/736
See application file for complete search history.

(56) References Cited

U.S. PATENT DOCUMENTS

| | | | | |
|---|---|---|---|---|
| 5,920,465 A | * | 7/1999 | Tanaka | H01R 12/62 361/749 |
| 6,942,492 B2 | * | 9/2005 | Alvarez | A63H 19/18 439/289 |

(Continued)

FOREIGN PATENT DOCUMENTS

KR    1020140034983    3/2014

*Primary Examiner* — Hung S Bui
(74) *Attorney, Agent, or Firm* — F. Chau & Associates, LLC

(57) ABSTRACT

A printed circuit board assembly includes a printed circuit board including a plurality of first conductive lines insulated from each other and an insulating layer disposed on the first conductive lines. The insulating layer having a recess disposed at a side surface of the insulating layer. The recess exposes the first conductive lines. The printed circuit board assembly further includes a flexible cable including a plurality of second conductive lines corresponding to the first conductive lines. The flexible cable is disposed in the recess.

24 Claims, 10 Drawing Sheets

(51) Int. Cl.
 *H05K 5/03* (2006.01)
 *H05K 7/14* (2006.01)
 *H05K 7/20* (2006.01)

(56) References Cited

U.S. PATENT DOCUMENTS

| | | | | |
|---|---|---|---|---|
| 7,526,816 | B2* | 5/2009 | Shak | A41D 11/00 |
| | | | | 2/114 |
| 8,264,654 | B2* | 9/2012 | Lee | G02F 1/13452 |
| | | | | 349/149 |
| 8,879,272 | B2* | 11/2014 | Yeates | H05K 1/117 |
| | | | | 361/748 |
| 8,941,013 | B2* | 1/2015 | Arnold | H01R 12/714 |
| | | | | 174/258 |
| 9,197,026 | B2 | 11/2015 | Kim et al. | |
| 9,655,276 | B2* | 5/2017 | Yang | H05K 7/1492 |
| 2006/0116005 | A1* | 6/2006 | Yu | H01R 13/631 |
| | | | | 439/67 |
| 2006/0281361 | A1* | 12/2006 | Uchida | H01R 12/79 |
| | | | | 439/492 |
| 2006/0286858 | A1* | 12/2006 | Uchida | H01R 12/721 |
| | | | | 439/495 |
| 2014/0267998 | A1* | 9/2014 | Kang | G02F 1/1345 |
| | | | | 349/150 |

\* cited by examiner

PRINTED CIRCUIT BOARD ASSEMBLY AND DISPLAY APPARATUS HAVING THE SAME

CROSS-REFERENCE TO RELATED APPLICATION

This application claims priority under 35 U.S.C. § 119 to Korean Patent Application No. 10-2016-0090591 filed on Jul. 18, 2016 in the Korean Intellectual Property Office (KIPO), the disclosure of which is incorporated by reference herein in its entirety.

TECHNICAL FIELD

Exemplary embodiments of the present inventive concept relate to a printed circuit board assembly and a display apparatus including the printed circuit board assembly.

DISCUSSION OF THE RELATED ART

A liquid crystal display ("LCD") apparatus may be a flat panel display apparatus that displays an image by using a liquid crystal layer including liquid crystal molecules. The LCD apparatus is relatively thin and light, consumes little power and has a low driving voltage compared to other display apparatuses. Accordingly, the LCD apparatus is broadly used in various industries.

The LCD device includes a display unit for displaying an image, a control printed circuit board for controlling and driving the display unit and a flexible cable to connect the control printed circuit board to the display unit.

As functions of the LCD device are developed, the number of output signals outputted from the control printed circuit board to the display unit increases, the number of conductive lines of the flexible cable increases and sizes of gaps between the conductive lines of the flexible cable decreases. Thus, display quality may deteriorate due to a defect of a connector connected to the flexible cable.

SUMMARY

According to an exemplary embodiment of the present inventive concept, a printed circuit board assembly includes a printed circuit board including a plurality of first conductive lines insulated from each other and an insulating layer disposed on the first conductive lines. The insulating layer having a recess disposed at a side surface of the insulating layer. The recess exposes the first conductive lines. The printed circuit board assembly further includes a flexible cable including a plurality of second conductive lines corresponding to the first conductive lines.

The flexible cable is disposed in the recess.

In an exemplary embodiment of the present inventive concept, the flexible cable further includes an insulating film. The second conductive lines are disposed on a first surface of the insulating film. The flexible cable further includes a cover film disposed on the first surface of the insulating film, and a guide line disposed on a second surface of the insulating film.

In an exemplary embodiment of the present inventive concept, the guide line extends in a longitudinal direction of the recess.

In an exemplary embodiment of the present inventive concept, the guide line includes a color ink or a color tape.

In an exemplary embodiment of the present inventive concept, the printed circuit board assembly further includes an adhesive disposed on the insulating film. The adhesive includes a two-sided tape.

In an exemplary embodiment of the present inventive concept, the flexible cable further includes an insulating film. The second conductive lines are disposed on a first surface of the insulating film. The flexible cable further includes a cover film disposed on the first surface of the insulating film, a handling element disposed on a second surface of the insulating film and protruded from the insulating film, and a guide line disposed on the handling element.

In an exemplary embodiment of the present inventive concept, the guide line extends in a longitudinal direction of the recess.

In an exemplary embodiment of the present inventive concept, the insulating layer has an embossed combining part disposed in the recess. The embossed combing part has a sawtooth shape.

In an exemplary embodiment of the present inventive concept, the flexible cable further includes an insulating film. The second conductive lines are disposed on a first surface of the insulating film. The flexible cable further includes a cover film disposed on the first surface of the insulating film, and a connecting element disposed on a second surface of the insulating film and having a recessed combining part.

In an exemplary embodiment of the present inventive concept, the printed circuit board assembly further includes a first cover layer covering the first conductive lines, and a second cover layer facing the first cover layer and covering the insulating layer.

According to an exemplary embodiment of the present inventive concept, a display apparatus includes a display panel configured to display an image, a driver connected to the display panel and configured to provide a driving signal to the display panel, and a printed circuit board assembly. The printed circuit board assembly includes a printed circuit board and a flexible cable, the printed circuit board including a plurality of first conductive lines and an insulating layer disposed on the first conductive lines. The first conductive lines being connected to the driver and configured to transmit a control signal to the driver the first conductive lines being insulated from each other. The insulating layer having a recess disposed at a side surface of the insulating layer, the recess exposing the first conductive lines, and the flexible cable including a plurality of second conductive lines corresponding to the first conductive lines, the flexible cable being disposed in the recess.

In an exemplary embodiment of the present inventive concept, the flexible cable further includes an insulating film. The second conductive lines are disposed on a first surface of the insulating film. The flexible cable further includes a cover film disposed on the first surface of the insulating film, and a guide line disposed on a second surface of the insulating film.

In an exemplary embodiment of the present inventive concept, the guide line extends in a longitudinal direction of the recess.

In an exemplary embodiment of the present inventive concept, the guide line includes a color ink or a color tape.

In an exemplary embodiment of the present inventive concept, the printed circuit board assembly further includes an adhesive disposed on the insulating film. The adhesive includes a two-sided tape.

In an exemplary embodiment of the present inventive concept, the flexible cable further includes an insulating film. The second conductive lines are disposed on a first surface of the insulating film. The flexible cable further includes a cover film disposed on the first surface of the insulating film, a handling element disposed on a second surface of the insulating film and protruded from the insulating film, and a guide line disposed on the handling element.

In an exemplary embodiment of the present inventive concept, the guide line extends in a longitudinal direction of the recess.

In an exemplary embodiment of the present inventive concept, the insulating layer has an embossed combining part disposed in the recess. The embossed combing part has a sawtooth shape.

In an exemplary embodiment of the present inventive concept, the flexible cable further includes an insulating film. The second conductive lines are disposed on a first surface of the insulating film. The flexible cable further includes a cover film disposed on the first surface of the insulating film, and a connecting element disposed on a second surface of the insulating film and having a recessed combining part.

In an exemplary embodiment of the present inventive concept, the printed circuit board assembly further includes a first cover layer covering the first conductive lines, and a second cover layer facing the first cover layer and covering the insulating layer.

According to an exemplary embodiment of the present inventive concept, a printed circuit board assembly includes a printed circuit board including a plurality of first conductive lines separated from each other, an insulating layer overlapping the first conductive lines, and an opening between the first cover film and the insulating layer. The opening exposes the first conductive lines. The printed circuit board assembly further includes a flexible cable disposed in the opening and including a plurality of second conductive lines connected to the first conductive lines.

In an exemplary embodiment of the present inventive concept, the flexible cable further includes an insulating film, a cover film, and a guide line. The second conductive lines are disposed between the insulating film and the cover film.

In an exemplary embodiment of the present inventive concept, the insulating film is disposed inside the opening, and the cover film is prevented from being positioned inside the opening by the guide line.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Exemplary embodiments of the present inventive concept will be described more fully hereinafter with reference to the accompanying drawings.

Figure 1:
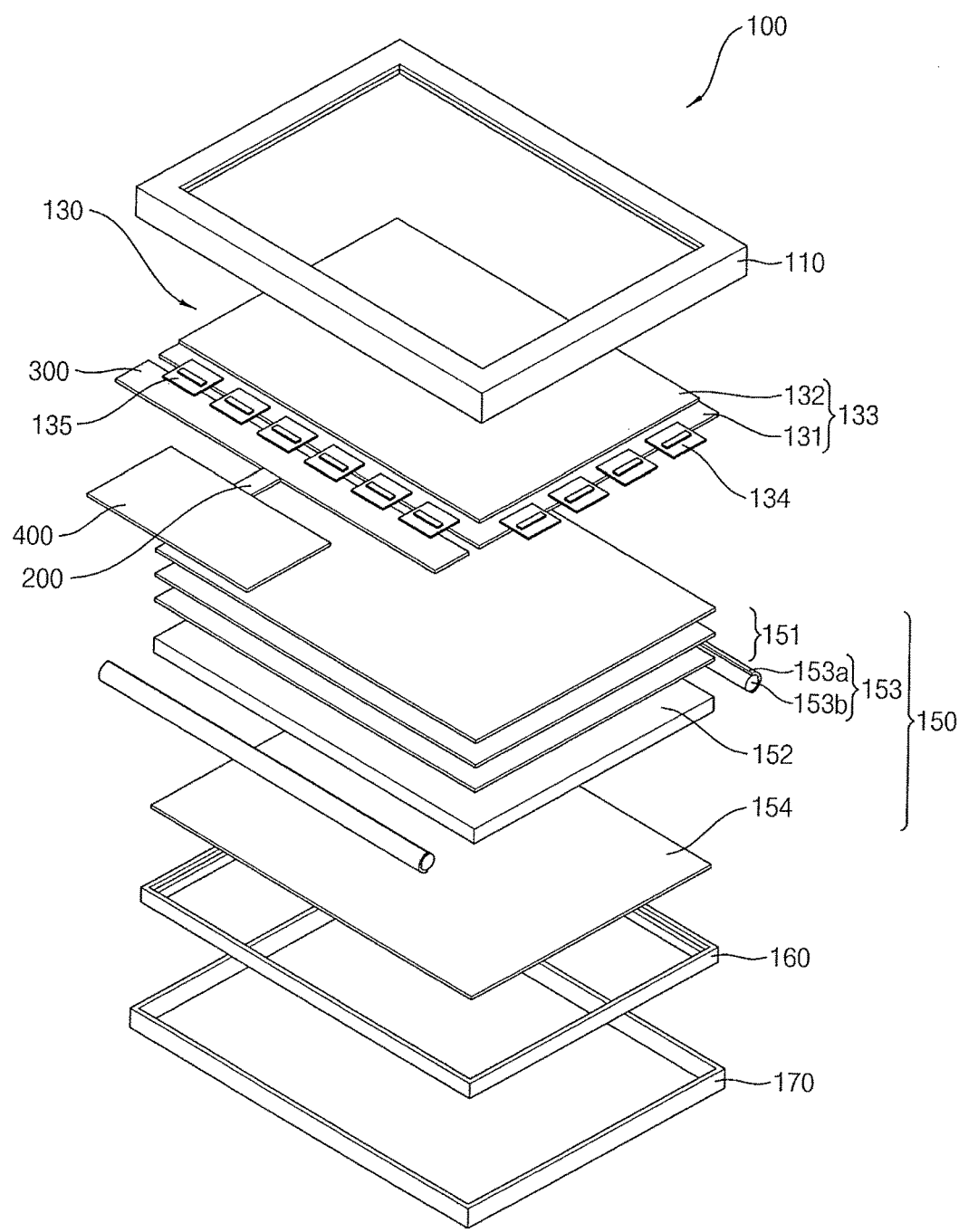
FIG. 1 is an exploded perspective view illustrating a display apparatus according to an exemplary embodiment of the present inventive concept.

FIG. 1 is an exploded perspective view illustrating a display apparatus according to an exemplary embodiment of the present inventive concept.

Referring to FIG. 1, the display apparatus 100 according to an exemplary embodiment of the present inventive concept includes a liquid crystal panel assembly 130, a backlight assembly 150, a mold frame 160, a lower receiving container 170 and an upper receiving container 110.

The liquid crystal panel assembly 130 includes a liquid crystal panel 133, a driver 134 and 135, a first printed circuit board 300 and a second printed circuit board 400. The liquid crystal panel 133 displays an image. The driver 134 and 135 is disposed at side portions of the liquid crystal panel 133 and drives the liquid crystal panel 133. The first printed circuit board 300 provides a driving signal and a control signal to the liquid crystal panel 133. The second printed circuit board 400 is connected to the first printed circuit board 300 through a flexible cable 200.

The liquid crystal panel 133 may include a first display substrate 131, a second display substrate 132 and a liquid crystal layer disposed between the first display substrate 131 and the second display substrate 132.

The first display substrate 131 includes a plurality of gate lines spaced apart from each other and extending in a first direction, a plurality of data lines spaced apart from each other and extending in a second direction to cross the gate lines, and a plurality of pixel electrodes disposed in a plurality of pixel areas which are arranged with intersections of the gate lines and the data lines. The plurality of gate lines and the plurality of data lines may be disposed on the first display substrate 131 in a matrix form. A plurality of thin film transistors, which are connected to a plurality of pixel electrodes and are configured to turn on and off in response to signals from the plurality of the gate lines and transmitting signals from the plurality of the data lines, may be formed on the first display substrate 131. In addition, a light blocking pattern to block light, a color filter pattern to display colors and a common electrode to display the image may be disposed on the second display substrate 132.

The first display substrate 131 and the second display substrate 132 are attached to each other with a uniform gap in between. The liquid crystal layer having an optical anisotropy may be disposed between the first display substrate 131 and the second display substrate 132.

The first printed circuit board 300 is disposed at a first side portion of the liquid crystal panel 133. The first printed circuit board 300 may be connected to the driver 134 and 135 (e.g., a source driver 135). A driving integrated circuit (IC) for driving the display panel may be mounted on a central portion of the source driver 135. Herein, the driver 134 and 135 may include a gate driver 134 and the source driver 135. The gate driver 134 may be connected to the gate lines of the first display substrate 131 and may provide the driving signal and the control signal to the gate lines. The source driver 135 may be connected to the data lines of the first display substrate 131 and may provide the driving signal and the control signal to the data lines.

The first printed circuit board 300 is electrically connected to the source driver 135. A plurality of electronic elements which generates the driving signals and the control signals to be provided to the liquid crystal panel 133 is mounted on the first printed circuit board 300. In addition, the second printed circuit board 400 is disposed adjacent to the first printed circuit board 300. The second printed circuit board 400 may be connected to the first printed circuit board 300 through the flexible cable 200. A plurality of additional electronic elements which generates the driving signals and the control signals to be provided to the liquid crystal panel 133 is mounted on the second printed circuit board 400. The driving signals and the control signals of the liquid crystal panel 133 generated by the second printed circuit board 400 may be provided to the first printed circuit board 300 through the flexible cable 200. The driving signals and the control signals provided to the first printed circuit board 300 may be transmitted to the liquid crystal panel 133 through the source driver 135 connected to the first printed circuit board 300.

For example, the first printed circuit board 300 and the second printed circuit board 400 may be grounded by using a lower receiving container 170 to prevent an error of the first printed circuit board 300 and the second printed circuit board 400 due to electromagnetic interference. The first printed circuit board 300 and the second printed circuit board 400 may be bent to a bottom plate of the lower receiving container 170 along a side wall of the lower receiving container 170. For example, the flexible cable 200 may be bent so that the second printed circuit board 400 is touching the bottom plate of the lower receiving container 170. The lower receiving container 170 may include a metal. For example, the first printed circuit board 300 may be in contact with the side wall of the lower receiving container 170 and the second printed circuit board 400 may be in contact with the bottom plate of the lower receiving container 170 so that an amount of contact between the lower receiving container 170 and both of the first and second printed circuit boards 300 and 400 may be maximized.

The flexible cable 200 may be electrically connected to the first printed circuit board 300 and the second printed circuit board 400. In the present exemplary embodiment, the flexible cable 200 may be, for example, a flexible flat cable ("FFC"). The flexible cable 200 may include a plurality of conductive lines. The conductive lines may include, for example, a conductive line to transmit a signal, a conductive line to transmit an operating voltage and a conductive line connected to a ground. An insulating film is attached to both sides of each of the conductive lines by an attaching layer including an adhesive. The insulating film may be flexible. For example, the insulating film may include polyethylene terephthalate (PET). In addition, the flexible cable 200 may be connected to the first printed circuit board 300 and the second printed circuit board 400 through a connector or an anisotropic conductive film ("ACF"). In an exemplary embodiment of the present inventive concept, the flexible cable 200 may be inserted into a recess formed at a side surface of the first printed circuit board 300 to be connected to the first printed circuit board 300. A connection between the flexible cable 200 and the first printed circuit board 300 may be explained referring to FIGS. 2 to 5.

In addition, the flexible cable 200 may be inserted into a recess formed at a side surface of the second printed circuit board 400 to be connected to the second printed circuit board 400.

The backlight assembly 150 for providing light to the liquid crystal panel 133 may be disposed under the liquid crystal panel 133. The backlight assembly 150 may include a light source unit 153, a light guide plate 152, a reflective sheet 154 and a plurality of optical sheets 151.

The light source unit 153 is disposed on at least one side portion of the light guide plate 152. For example, the light source unit 153 may be disposed on a first side portion of the light guide plate 152 and a second side portion of the light guide plate 152 facing the first side portion. The light source unit 153 may include a light source 153b and a light source cover 153a covering the light source 153b. The light source 153b may be a linear light source such as a cold cathode fluorescent lamp ("CCFL"), hot cathode fluorescent lamp ("HCFL") and so on. The light source 153b may be a point light source such as a light emitting diode ("LED") and so on. The light source unit 153 may be disposed adjacent to a longer side or a shorter side of the light guide plate 152 having a rectangular shape. For example, two light source units 153 may be disposed adjacent to two adjacent sides or two sides facing each other. In FIG. 1, the two light source units 153 are each disposed adjacent to two longer sides of the light guide plate 152 facing each other.

The light guide plate 152 has a rectangular shape. The light guide plate 152 guides light emitted from the light source unit 153 to an upper direction of the backlight assembly 150.

The light guide plate 152 guides light emitted from the light source unit 153 toward the liquid crystal panel 133. The light guide plate 152 may include a material having a high reflective index and a high transmittance. For example, the light guide plate 152 may include polymethyl metacrylate (PMMA), polycarbonate (PC) or polyethylene (PE).

The reflective sheet 154 may be disposed under the light guide plate 152. For example, the reflective sheet 154 may be disposed on a lower surface of the light guide plate 152. The reflective sheet 154 reflects light that may leak through a lower surface of the light guide plate 152 to an upper surface of the light guide plate 152 so that the luminance of the backlight assembly 150 may increase and the light emitted from the upper surface of the light guide plate 152 may be uniform. The reflective sheet 154 may include an element having a high elasticity, a high reflectivity and a thin thickness. For example, the reflective sheet 154 may include polyethylene terephthalate (PET).

The optical sheets 151 may be disposed on the light guide plate 152. The optical sheets 151 may increase uniformity of the light emitted from the upper surface of the light guide plate 152 to the upper direction of the backlight assembly 150. For example, the optical sheets 151 may include a diffusion sheet, a prism sheet or a protection sheet. The optical sheets 151 may include a transparent resin such as an acrylic resin, polyurethane, a silicon resin and so on.

The mold frame 160 receives the backlight assembly 150, such that the backlight assembly 150 may be disposed therein. The mold frame 160 may be a frame having a rectangular shape with a rectangular inner hole. The mold frame 160 may include an insulating synthetic resin.

The lower receiving container 170 is disposed under the backlight assembly 150. The lower receiving container 170 may receive and support the liquid crystal panel 133, the backlight assembly 150 and the mold frame 160. The lower receiving container 170 may include, for example, aluminum or an alloy of aluminum. The first printed circuit board 300 may be in contact with the side wall of the lower receiving container 170. The second printed circuit board 400 may be bent toward the bottom plate of the lower receiving container 170 and may be in contact with the bottom plate of the lower receiving container 170. For example, the flexible cable 200 may be bent so that the second printed circuit board 400 is in contact with the bottom plate of the lower receiving container 170.

The upper receiving container 110 is combined with the lower receiving container 170. The liquid crystal panel assembly 130 and the backlight assembly 150 are received in the upper receiving container 110 and the lower receiving container 170. The upper receiving container 110 may be a display area. In, for example, the display area an image may be displayed through an inner opening provided in the upper receiving container 110. The upper receiving container 110 may be combined with the lower receiving container 170 by, for example, a hook. For example, the upper receiving container 110 may be combined with the lower receiving container 170 by one of various combining methods.

Figure 2:
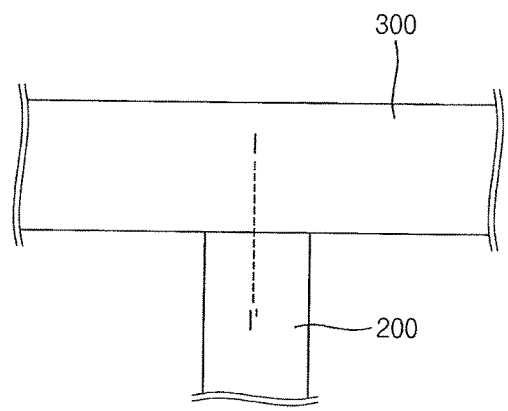
FIG. 2 is a plan view illustrating a printed circuit board assembly of FIG. 1 according to an exemplary embodiment of the present inventive concept.
Figure 3:
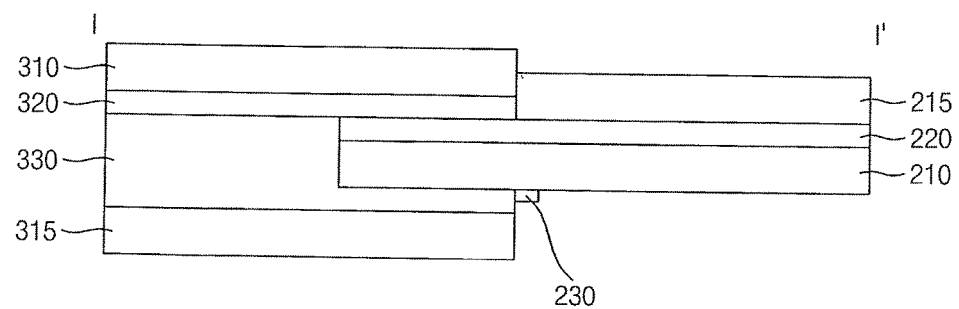
FIG. 3 is a cross-sectional view cut along a line I-I' in FIG. 2 according to an exemplary embodiment of the present inventive concept.
Figure 4:
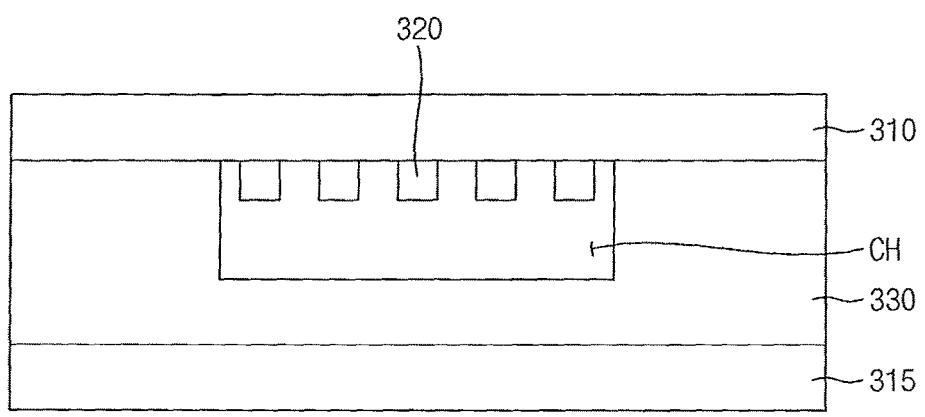
FIG. 4 is a side view illustrating a first printed circuit board of FIG. 3 according to an exemplary embodiment of the present inventive concept.
Figure 5:
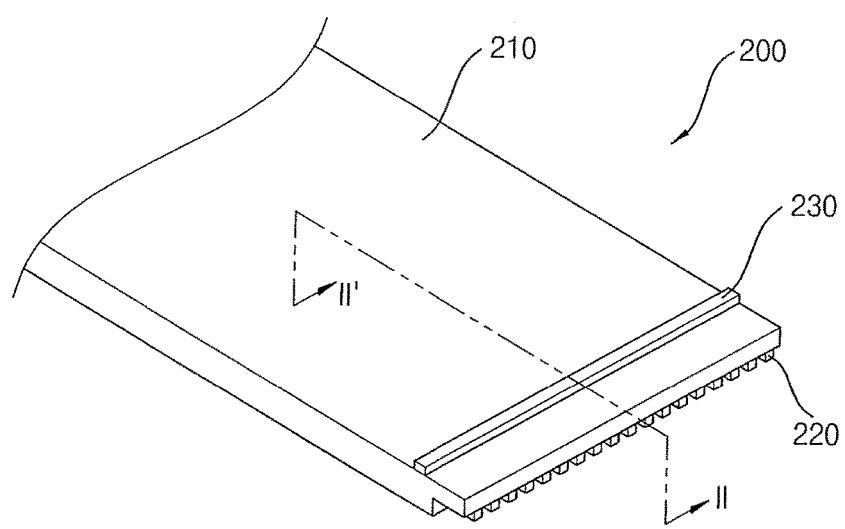
FIG. 5 is a perspective view illustrating a flexible cable of FIG. 3 according to an exemplary embodiment of the present inventive concept.
Figure 6:
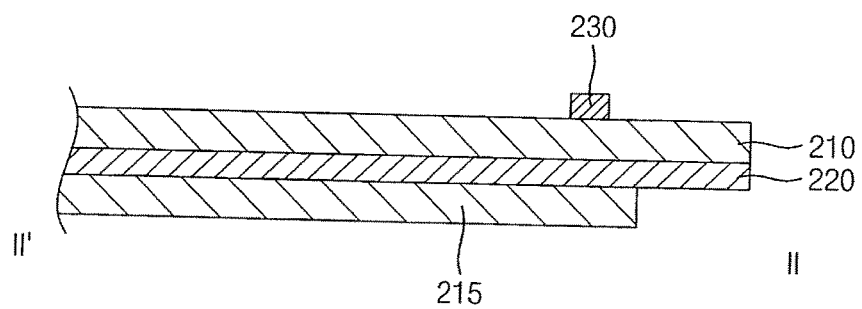
FIG. 6 is a cross-sectional view cut along a line II'-II in FIG. 5 according to an exemplary embodiment of the present inventive concept.

FIG. 2 is a plan view illustrating the printed circuit board assembly of FIG. 1 according to an exemplary embodiment of the present inventive concept. FIG. 3 is a cross-sectional view cut along a line I-I' in FIG. 2 according to an exemplary embodiment of the present inventive concept. FIG. 4 is a side view illustrating the printed circuit board 300 of FIG. 3 according to an exemplary embodiment of the present inventive concept. FIG. 5 is a perspective view illustrating the flexible cable 200 of FIG. 3 according to an exemplary embodiment of the present inventive concept. FIG. 6 is a cross-sectional view cut along a line II'-II in FIG. 5 according to an exemplary embodiment of the present inventive concept.

Referring to FIGS. 2 to 6, the printed circuit board assembly includes the flexible cable 200 and the first printed circuit board 300.

The first printed circuit board 300 includes a first cover layer 310, a plurality of first conductive lines 320, an insulating layer 330 and a second cover layer 315.

The first conductive lines 320 may be disposed on the first cover layer 310 and may be spaced apart from each other. The first conductive lines 320 may be insulated from each other.

The first cover layer 310 covers the first conductive lines 320 at an outermost layer. For example, the first cover layer 310 may be a solder resist layer.

The insulating layer 330 is disposed under the first conductive lines 320. The insulating layer 330 covers the first conductive lines 320 to insulate the first conductive lines 320.

For example, the insulating layer 330 may include glass epoxy laminate. However, the present inventive concept is not limited thereto. In addition, the insulating layer 330 may include one of various resin compounds to insulate the first conductive lines 320.

A side surface of the insulating layer 330 may have a recess CH (e.g., an opening) provided toward an inner direction of the insulating layer 330. The recess CH may expose portions of the first conductive lines 320. The recess CH may be formed at a side surface of the first printed circuit board 300.

In an exemplary embodiment of the present inventive concept, the first printed circuit board 300 may include an opening that exposes portions of the first conductive lines 320 and is between the first cover layer 310 and the insulating layer 330.

The second cover layer 315 may be disposed on a bottom surface of the insulating layer 330 and may face the first cover layer 310. The second cover layer 315 covers the insulating layer 330.

In conventional method, a connector is provided on a printed circuit board and a flexible cable is connected to the connector. However, when the connector has a defect, the flexible cable might not be connected to the printed circuit board and the display apparatus may have a defect.

However, according to the present exemplary embodiment, the first printed circuit board 300 has the recess CH formed at the side surface of the first printed circuit board 300. The recess CH exposes end portions of the first conductive lines 320. The flexible cable 200 may be inserted into the recess CH so that second conductive lines 220 may be electrically connected to the first conductive lines 320 which are exposed by the recess CH. Thus, the flexible cable 200 may be electrically connected to the first printed circuit board 300 without an additional connector. When the additional connector is not used, defects resulting therefrom do not impact the quality of the display apparatus.

Furthermore, in a conventional method, the additional connector may be provided on an outside surface of the printed circuit board. Thus, the thickness of the printed circuit board may be increased. However, according to the present exemplary embodiment, the first printed circuit board 300 includes the recess CH formed at the side surface of the first printed circuit board 300, so that the flexible cable 200 can be directly inserted into the recess CH. Thus, the thickness of the first printed circuit board 300 may be reduced.

The flexible cable 200 includes an insulating film 210, a plurality of second conductive lines 220 and a cover film 215.

For example, the insulating film 210 includes a flexible and insulating material. The second conductive lines 220 are provided between the insulating film 210 and the cover film 215. For example, the second conductive lines 220 may be disposed on the insulating film 210. The second conductive lines 220 transmit the control signals outputted from the second printed circuit board 400 to the first printed circuit board 300 to control the liquid crystal panel 133. From the first printed circuit board 300, the control signals are transmitted to the source driver 135. The second conductive lines 220 are spaced apart from each other and insulated from each other. The second conductive lines 220 may include a metal. For example, the second conductive lines 220 may include copper (Cu).

The cover film 215 is disposed on the insulating film 210 to cover the second conductive lines 220. The cover film 215 has a length shorter than that of the second conducting lines 220 so that end portions of the second conducting lines 220 are exposed. In other words, the second conducting lines 200 extend beyond the cover film 215. The exposed end portions of the second conducting lines 220 are connected to the first conductive lines 320 of the first printed circuit board 300.

A guide line 230 is disposed on the insulating film 210. The guide line 230 guides a connecting position of the flexible cable 200 with the recess CH formed at the first printed circuit board 300. The guide line 230 is disposed adjacent to an end portion of the flexible cable 200 which is inserted into the recess CH. For example, the guide line 230 may be adjacent to the portion of the flexible cable 200 where the second conductive lines 220 extend beyond the cover film 215. The guide line 230 may be a straight line extending in a width direction of the insulating film 210. The guide line 230 may extend across the insulating film 210 in a direction toward a longitudinal side of the insulating film 210. The guide line 230 may be a color ink or a color tape attached to the insulating film 210 and easily shown.

A position of the guide line 230 may be determined considering a portion of the flexible cable 200 which is inserted into the recess CH. The flexible cable 200 may be inserted into the recess CH. The length of the flexible cable 200 to be inserted into the recess CH may be predetermined. The guideline 230 may determine how much of the flexible cable 200 is put into the recess CH. For example, the insulating film 210 is disposed inside of the recess CH, and the cover film 215 may be prevented from being positioned inside of the recess CH by the guide line 230. The guide line 230 might not be inserted into the recess CH, and thus, the guide line 230 is exposed and extends parallel to an outer boundary of the recess CH of the first printed circuit board 300. By comparing the guide line 230 and the position of the recess CH, a determination can be made as to whether the flexible cable 200 has a secure connection to the first printed circuit board 300 or not.

Figure 7:
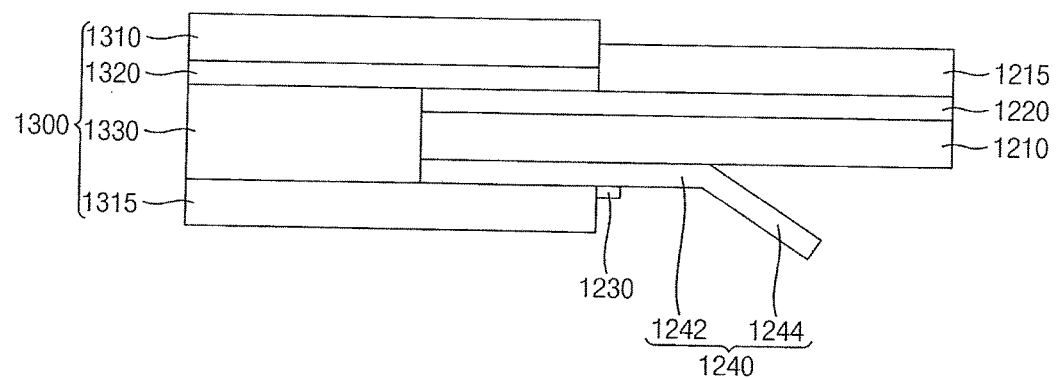
FIG. 7 is a cross-sectional view cut along a line I-I' in FIG. 2 according to an exemplary embodiment of the present inventive concept.
Figure 8:
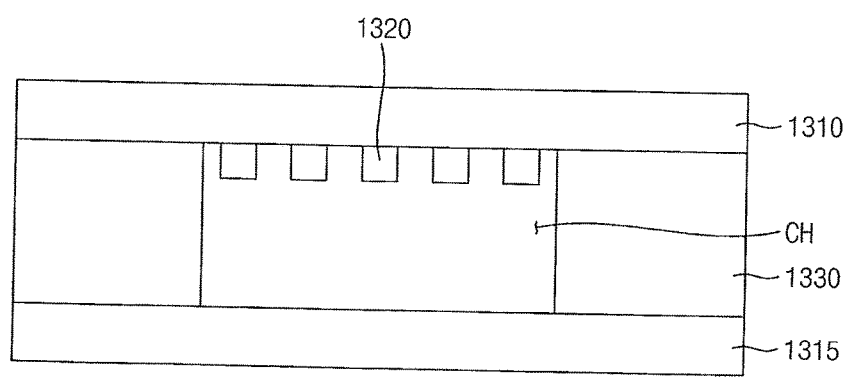
FIG. 8 is a side view illustrating a printed circuit board of FIG. 7 according to an exemplary embodiment of the present inventive concept.
Figure 9:
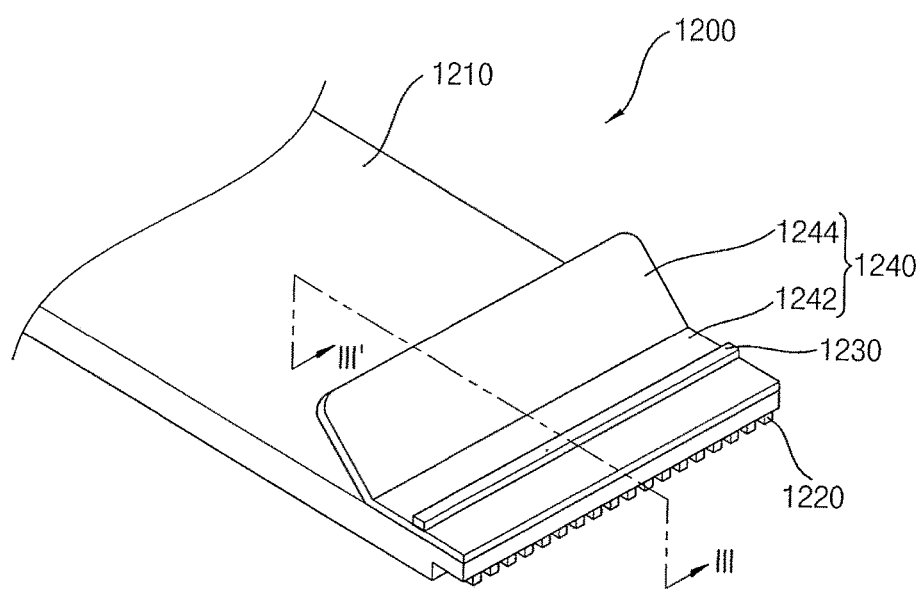
FIG. 9 is a perspective view illustrating a flexible cable of FIG. 7 according to an exemplary embodiment of the present inventive concept.
Figure 10:
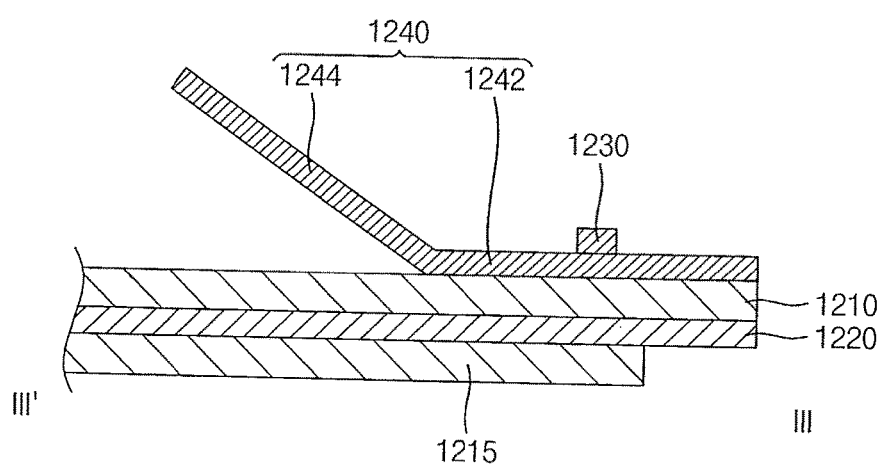
FIG. 10 is a cross-sectional view cut along a line III'-III in FIG. 9 according to an exemplary embodiment of the present inventive concept.

FIG. 7 is a cross-sectional view cut along a line I-I' in FIG. 2 according to an exemplary embodiment of the present inventive concept. FIG. 8 is a side view illustrating a printed circuit board of FIG. 7 according to an exemplary embodiment of the present inventive concept. FIG. 9 is a perspective view illustrating a flexible cable of FIG. 7 according to an exemplary embodiment of the present inventive concept. FIG. 10 is a cross-sectional view cut along a line III'-III in FIG. 9 according to an exemplary embodiment of the present inventive concept.

Referring to FIGS. 7 to 10, a printed circuit board assembly includes a flexible cable 1200 and a printed circuit board 1300.

The printed circuit board 1300 includes a first cover layer 1310, a plurality of first conductive lines 1320, an insulating layer 1330 and a second cover layer 1315.

The first conductive lines 1320 may be disposed on the first cover layer 1310 and may be spaced apart from each other. The first conductive lines 1320 may be insulated from each other.

The first cover layer 1310 covers the first conductive lines 1320 at an outermost layer. For example, the first cover layer 1310 may be a solder resist layer.

The insulating layer 1330 is disposed under the first conductive lines 1320. The insulating layer 1330 covers the first conductive lines 1320 to insulate the first conductive lines 1320. For example, the insulating layer 1330 may include glass epoxy laminate. However, the present inventive concept is not limited thereto. For example, the insulating layer 1330 may include one of various resin compounds to insulate the first conductive lines 1320.

A side surface of the insulating layer 1330 may have a recess CH formed toward an inner direction of the insulating layer 1330. The recess CH may expose portions of the first conductive lines 1320. The recess CH may be formed at a side surface of the printed circuit board 1300.

In conventional method, a connector is provided on a printed circuit board and a flexible cable is connected to the connector. However, when the connector has a defect, the flexible cable might not be connected to the printed circuit board and the display apparatus may have a defect.

However, according to the present exemplary embodiment of the present invention, the printed circuit board 1300 has the recess CH formed at the side surface of the printed circuit board 1300. The recess CH exposes end portions of the first conductive lines 1320. The flexible cable 1200 may be inserted into the recess CH so that second conductive lines 1220 may be electrically connected to the first conductive lines 1320 which are exposed by the recess CH. Thus, the flexible cable 1200 may be electrically connected to the printed circuit board 1300 without an additional connector on the printed circuit board 1300. When the additional connector is not used, defects resulting therefrom do not impact the quality of the display apparatus.

Furthermore, in a conventional method, the additional connector may be provided on an outside surface of the printed circuit board. Thus, the thickness of the printed circuit board may be increased. However, according to the present exemplary embodiment, the printed circuit board 1300 includes the recess CH provided in the side surface of the printed circuit board 1300, so that the flexible cable 1200 can be directly inserted into the recess CH. Thus, the thickness of the printed circuit board 1300 may be reduced.

The flexible cable 1200 includes an insulating film 1210, a plurality of second conductive lines 1220, a cover film 1215 and a handling element 1240.

For example, the insulating film 1210 includes a flexible and insulating material. The second conductive lines 1220 are provided between the insulating film 1210 and the cover film 1215. The second conductive lines 1220 transmit the control signals outputted from another printed circuit board to the printed circuit board 1300 to control the liquid crystal panel 133. The second conductive lines 1220 are spaced apart from each other and insulated from each other. The second conductive lines 1220 may include a metal. For example, the second conductive lines 1220 may include copper (Cu).

The cover film 1215 is disposed on the second conductive lines 1220 to cover the second conductive lines 1220. The cover film 1215 has a length shorter than that of the second conducting lines 1220 so that end portions of the second conducting lines 1220 are exposed. In other words, the second conducting lines 1200 extend beyond the cover film 1215. The exposed end portions of the second conducting lines 1220 are connected to the first conductive lines 1320 of the printed circuit board 1300.

The handling element 1240 may be disposed on the insulating film 1210 and includes a flexible and insulating material. For example, the handling element 1240 includes one of poly vinyl chloride (PVC), polyvinylidene chloride (PVDC), polyethylene terephthalate (PET), poly carbonate (PC) and so on.

The handling element 1240 includes an attaching part 1242 and a handle 1244. The attaching part 1242 and the handle 1244 may be integrally formed. The attaching part 1242 is attached to an upper surface of the insulating film 1210. The handle 1244 extends from the attaching part 1242 to be spaced apart from the upper surface of the insulating film 1210. The handle 1244 may be a bent portion which is bent from the attaching part 1242. For example, the handle 1244 may be bent such that it forms an angle with respect to the upper surface of the insulating film 1210. The flexible cable 1200 may be inserted into the recess CH by using the handle 1244, which may increase manufacturing efficiency. This step may be manually performed.

A guide line 1230 may be disposed on the handling element 1240. The guide line 1230 guides a connecting position of the flexible cable 1200 with the recess CH formed at the printed circuit board 1300. The guide line 1230 is disposed adjacent to an end portion of the flexible cable 1200 which is inserted into the recess CH. The guide line 1230 may be a straight line extending in a width direction of the insulating film 1210. The guide line 1230 may extend in a direction toward a longitudinal side of the insulating film 1210. The guide line 1230 may be a color ink or a color tape attached to the attaching part 1242 and easily shown.

A position of the guide line 1230 may be determined considering a portion of the flexible cable 1200 which is inserted into the recess CH. The flexible cable 1200 may be inserted into the recess CH. The length of the flexible cable 1200 to be inserted into the recess CH may be predetermined. The guide line 1230 might not be inserted into the recess CH, and thus, the guide line 1230 is exposed and extends in parallel to an outer boundary of the recess CH of the printed circuit board 1300. By comparing the guide line 1230 and the position of the recess CH, a determination can be made as to whether the flexible cable 1200 has a secure connection to the printed circuit board 1300 or not.

Figure 11:
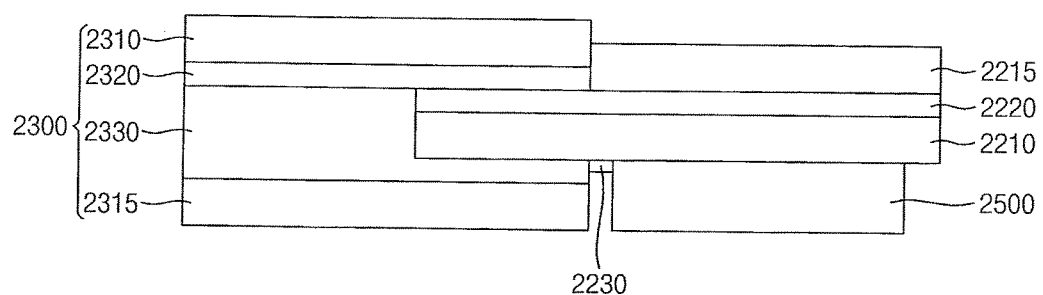
FIG. 11 is a cross-sectional view cut along a line I-I' in FIG. 2 according to an exemplary embodiment of the present inventive concept.
Figure 12:
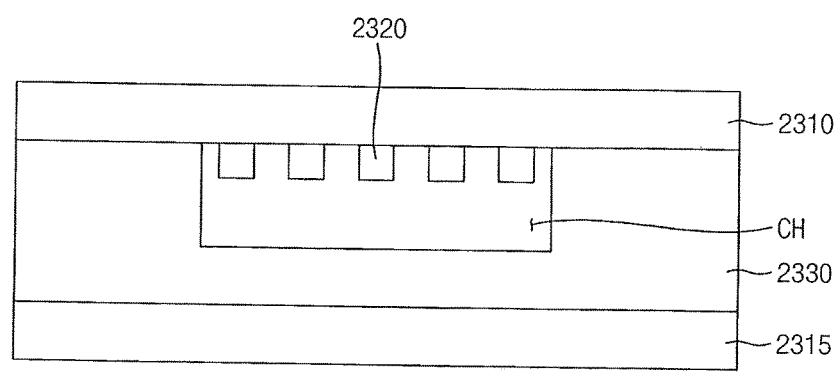
FIG. 12 is a side view illustrating a printed circuit board of FIG. 11 according to an exemplary embodiment of the present inventive concept.
Figure 13:
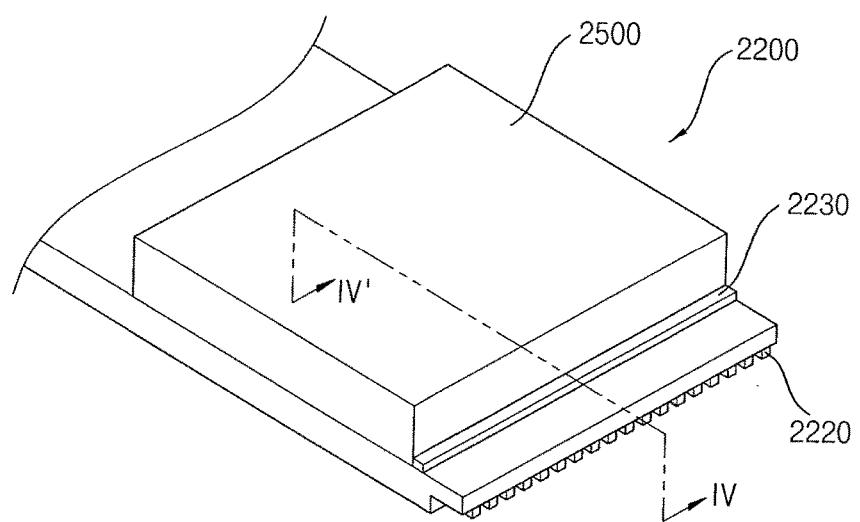
FIG. 13 is a perspective view illustrating a flexible cable of FIG. 11 according to an exemplary embodiment of the present inventive concept.
Figure 14:
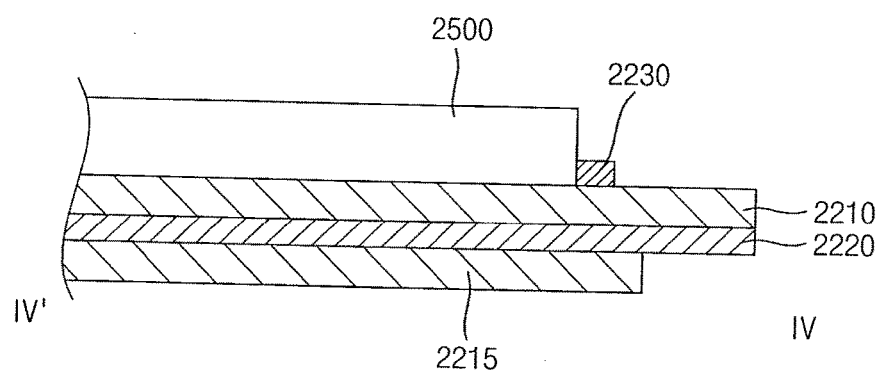
FIG. 14 is a cross-sectional view cut along a line IV'-IV in FIG. 11 according to an exemplary embodiment of the present inventive concept.

FIG. 11 is a cross-sectional view cut along a line I-I' in FIG. 2 according to an exemplary embodiment of the present inventive concept. FIG. 12 is a side view illustrating a printed circuit board of FIG. 11 according to an exemplary embodiment of the present inventive concept. FIG. 13 is a perspective view illustrating a flexible cable of FIG. 11 according to an exemplary embodiment of the present inventive concept. FIG. 14 is a cross-sectional view cut along a line IV'-IV in FIG. 11 according to an exemplary embodiment of the present inventive concept.

The printed circuit board assembly according to the present exemplary embodiment is substantially the same as the printed circuit board assembly of explained with reference to FIGS. 2 to 6 except for an adhesive 2500. Thus, the same reference numerals may be used to refer to the same or like parts as those described in FIGS. 2 to 6 and any repetitive explanation concerning the above elements may be omitted.

Referring to FIGS. 11 to 14, a printed circuit board assembly includes a flexible cable 2200 and a printed circuit board 2300.

The flexible cable 2200 includes an insulating film 2210, a plurality of second conductive lines 2220, a cover film 2215 and an adhesive 2500.

A first surface of the adhesive 2500 may be disposed on the insulating film 2210. In addition, a second surface of the adhesive 2500 opposite to the first surface of the adhesive 2500 may be attached to a side surface of the lower receiving container 170 of the display apparatus 100. However, the present inventive concept is not limited thereto. For example, the second surface of the adhesive 2500 may be attached to another portion of the display apparatus 100.

The flexible cable 2200 may be fixed by the adhesive 2500. Accordingly, the connectivity of the flexible cable 2200 with the printed circuit board 2300 may be increased. For example, the adhesive 2500 may be a both-sided tape. However, the present inventive concept is not limited thereto. For example, the adhesive 2500 may be another material having adhesion on both sides thereof.

Figure 15:
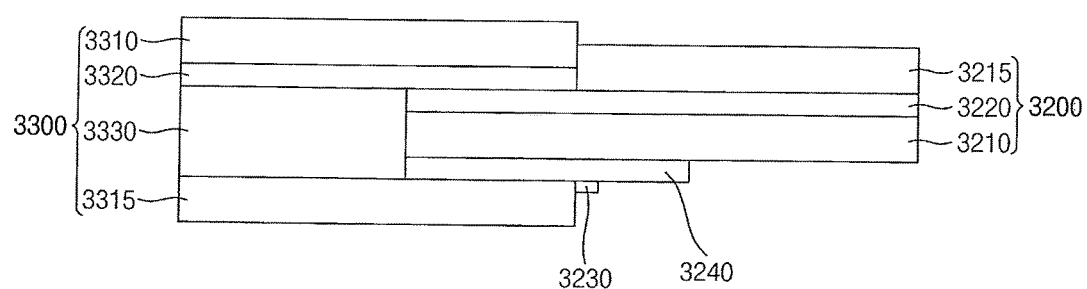
FIG. 15 is a cross-sectional view cut along a line I-I' in FIG. 2 according to an exemplary embodiment of the present inventive concept.
Figure 16:
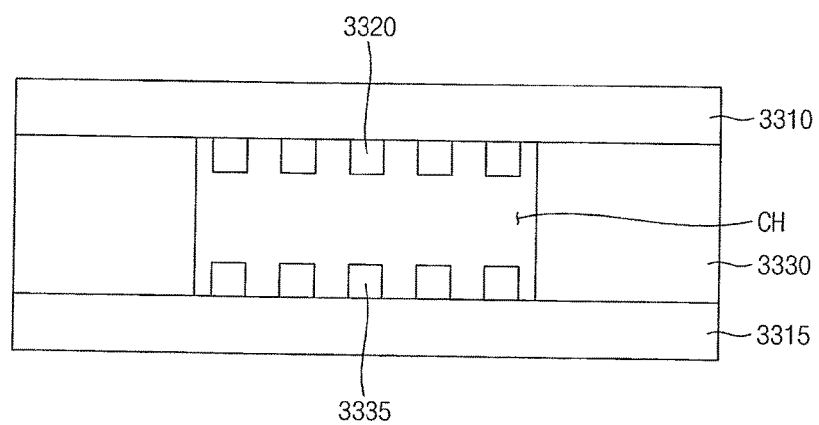
FIG. 16 is a side view illustrating a printed circuit board of FIG. 15 according to an exemplary embodiment of the present inventive concept.
Figure 17:
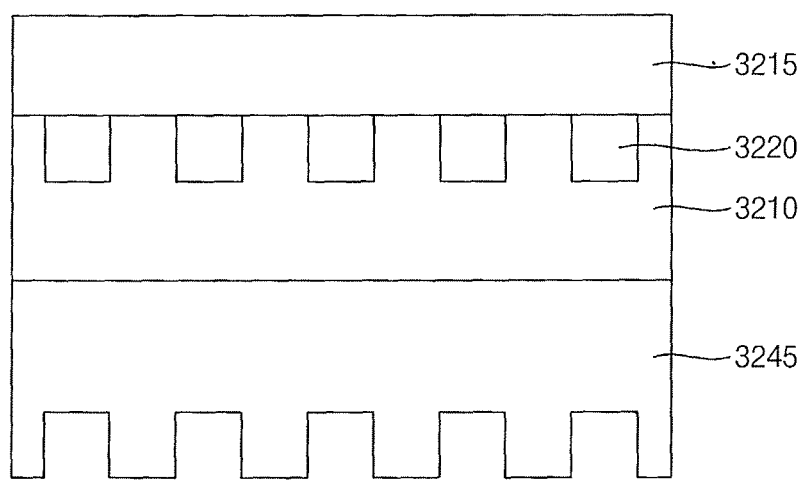
FIG. 17 is a perspective view illustrating a flexible cable of FIG. 15 according to an exemplary embodiment of the present inventive concept.
Figure 18:
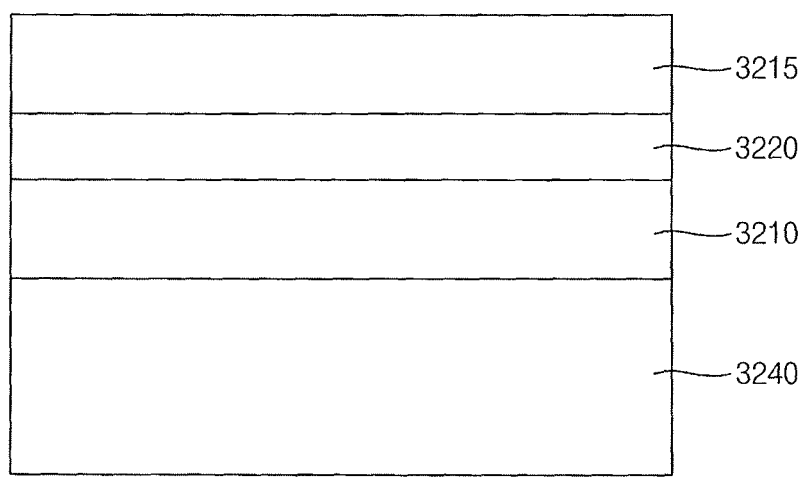
FIG. 18 is a perspective view illustrating a flexible cable of FIG. 15 according to an exemplary embodiment of the present inventive concept.

FIG. 15 is a cross-sectional view cut along a line I-I' in FIG. 2 according to an exemplary embodiment of the present inventive concept. FIG. 16 is a side view illustrating a printed circuit board of FIG. 15 according to an exemplary embodiment of the present inventive concept. FIG. 17 is a perspective view illustrating a flexible cable of FIG. 15 according to an exemplary embodiment of the present inventive concept. FIG. 18 is a perspective view illustrating a flexible cable 3200 of FIG. 15 according to an exemplary embodiment of the present inventive concept.

Referring to FIGS. 15 to 18, the printed circuit board assembly includes a flexible cable 3200 and a printed circuit board 3300.

The printed circuit board 3300 includes a first cover layer 3310, a plurality of first conductive lines 3320, an insulating layer 3330 and a second cover layer 3315.

The first conductive lines 3320 may be disposed on the first cover layer 3310 and may be spaced apart from each other. The first conductive lines 3320 may be insulated from each other.

The first cover layer 3310 covers the first conductive lines 3320 at an outermost layer. For example, the first cover layer 3310 may be a solder resist layer.

The insulating layer 3330 is disposed under the first conductive lines 3320. The insulating layer 3330 covers the first conductive lines 3320 to insulate the first conductive lines 3320. For example, the insulating layer 3330 may include glass epoxy laminate. However, the present inventive concept is not limited thereto. For example, the insulating layer 3330 may include one of various resin compounds to insulate the first conductive lines 3320.

A side surface of the insulating layer 3330 may have a recess CH formed toward an inner direction of the insulating layer 3330. The recess CH may expose portions of the first conductive lines 3320. The recess CH may be provided in a side surface of the printed circuit board 3300.

The insulating layer 3330 may have an embossed combining part 3335 having a sawtooth shape. For example, the embossed combining part 3335 may have a shape substantially the same as the first conductive lines 3320. The embossed combining part 3335 may be formed by patterning a portion of the insulating layer 3330 adjacent to the second cover layer 3315. For example, the embossed combining part 3335 may be formed by eliminating the portions of the insulating layer 3330 adjacent to the second cover layer 3315 to provide uniform gaps or openings. The embossed combining part 3335 may include a plurality of polygonal shapes extending in a direction toward the first conductive lines 3320. The plurality of polygonal (or line) shapes of the embossed combining part 3335 may be spaced apart from each other in a same arrangement as that of the first conductive lines 3320. The embossed combining part 3335 may have the sawtooth shape in a cross sectional view.

In conventional method, a connector is provided on a printed circuit board and a flexible cable is connected to the connector. However, when the connector has a defect, the flexible cable might not be connected to the printed circuit board and the display apparatus may have a defect.

However, according to the present exemplary embodiment, the printed circuit board 3300 has the recess CH formed at the side surface of the printed circuit board 3300. The recess CH exposes end portions of the first conductive lines 3320. The flexible cable 3200 may be inserted into the recess CH so that second conductive lines 3220 may be electrically connected to the first conductive lines 3320 which are exposed by the recess CH. Thus, the flexible cable 3200 may be electrically connected to the printed circuit board 3300 without an additional connector. When the additional connector is not used, defects resulting therefrom do not impact the quality of the display apparatus.

Furthermore, in a conventional method, the additional connector may be provided on an outside surface of the printed circuit board. Thus, the thickness of the printed circuit board may be increased. However, according to the present exemplary embodiment of the present inventive concept, the printed circuit board 3300 includes the recess CH formed at the side surface of the printed circuit board 3300, so that the flexible cable 3200 can be directly inserted into the recess CH. Thus, the thickness of the printed circuit board 3300 may be reduced.

The flexible cable 3200 includes an insulating film 3210, a plurality of second conductive lines 3220, a cover film 3215 and a connecting element 3240.

For example, the insulating film 3210 includes a flexible and insulating material. The second conductive lines 3220 are provided between the insulating film 3210 and the cover film 3215. The second conductive lines 3220 transmit the control signals outputted from a second printed circuit board to the printed circuit board 3300 to control the liquid crystal panel 133. The second conductive lines 3220 are spaced apart from each other and insulated from each other. The second conductive lines 3220 may include a metal. For example, the second conductive lines 3220 may include copper (Cu).

The cover film 3215 is disposed on the second conductive lines 3220 to cover the second conductive lines 3220. The cover film 3215 has a length shorter than that of the second conducting lines 3220 so that end portions of the second conducting lines 3220 are exposed. The exposed end portions of the second conducting lines 3220 are connected to the first conductive lines 3320 of the printed circuit board 3300.

The connecting element 3240 includes a flexible and insulating material. For example, the connecting element 3240 includes poly vinyl chloride (PVC), polyvinylidene chloride (PVDC), polyethylene terephthalate (PET), poly carbonate (PC) and so on.

The connecting element 3240 may be disposed on the insulating film 3210 and may have a recessed combining part 3245 having an inverted shape of a shape of the embossed combining part 3335. In other words, the recessed combining part 3245 is configured such that the embossed combing part 3335 can be conformally inserted therein. The recessed combining part 3245 is formed to have the inverted shape of the embossed combining part 3335. For example, the recessed combining part 3245 may be formed by removing a portion of the connecting element 3240 to provide uniform gaps. The gaps may be configured such that they can receive the embossed combining part 3335.

When the flexible cable 3200 is inserted into the recess CH of the printed circuit board 3300, the embossed combining part 3335 and the recessed combining part 3245 having the inverted shape are combined so that the connectivity between the flexible cable 3200 and the printed circuit board 3300 may be increased.

A guide line 3230 may be disposed on the connecting element 3240. The guide line 3230 guides a connecting position of the flexible cable 3200 with the recess CH formed at the printed circuit board 3300. The guide line 3230 is disposed adjacent to an end portion of the flexible cable 3200 which is inserted into the recess CH. The guide line 3230 may be a straight line extending in a width direction of the insulating film 3210. The guide line 3230 may extend across the insulating film 3210 in a direction toward a longitudinal side of the insulating film 3210. The guide line 3230 may be a color ink or a color tape attached to the connecting element 3240 and easily shown.

According to the above explained exemplary embodiments of the present inventive concept, the printed circuit board has the recess formed at the side surface thereof. The flexible cable may be inserted into the recess. The conductive lines of the printed circuit board exposed by the recess are electrically connected to the conductive lines of the flexible cable. Thus, the flexible cable may be electrically connected to the printed circuit board without an additional connector. Since an additional connector is not used, the defect of the display apparatus due to connector may be prevented.

In addition, since the printed circuit board includes the recess formed at the side surface thereof, the flexible cable can be directly inserted into the recess, and thus, the thickness of the printed circuit board may be reduced.

While the present inventive concept has been described with reference to exemplary embodiments thereof, it will be understood by those of ordinary skill in the art that various changes in form and details may be made thereto without departing from the spirit and scope of the present inventive concept as defined by the following claims.

What is claimed is:

1. A printed circuit board assembly comprising:
    a printed circuit board including: a plurality of first conductive lines insulated from each other; an insulating layer disposed on the first conductive lines; and a first cover layer disposed on the insulating layer, wherein the insulating layer has a recess disposed at a side surface of the insulating layer, wherein the recess exposes the first conductive lines, and opposing sides of the recess are formed by the insulating layer and the first cover layer; and
    a flexible cable including a plurality of second conductive lines corresponding to the first conductive lines, wherein the flexible cable is disposed in the recess.

2. The printed circuit board assembly of claim 1, wherein the flexible cable further comprises;
    an insulating film, wherein the second conductive lines are disposed on a first surface of the insulating film;
    a cover film disposed on the first surface of the insulating film; and
    a guide line disposed on a. second surface of the insulating film.

3. The printed circuit board assembly of claim 2, wherein the guide line extends in a longitudinal direction of the recess.

4. The printed circuit board assembly of claim 3, wherein the guide line includes a color ink or a color tape.

5. The printed circuit board assembly of claim 2, further comprising an adhesive disposed on the insulating film, wherein the adhesive includes a two-sided tape.

6. The printed circuit board assembly of claim 1, wherein the flexible cable further comprises:
an insulating film, wherein the second conductive lines are disposed on a first surface of the insulating film;
a cover film disposed on the first surface of the insulating film;
a handling element disposed on a second surface of the insulating film and protruded from the insulating film; and
a guide line disposed on the handling element.

7. The printed circuit board assembly of claim 6, wherein the guide line extends in a longitudinal direction of the recess.

8. The printed circuit board assembly of claim 1, wherein the insulating layer has an embossed combining part disposed in the recess, wherein the embossed combing part has a sawtooth shape.

9. The printed circuit board assembly of claim 8, wherein the flexible cable further comprises:
an insulating film, wherein the second conductive lines are disposed on a first surface of the insulating film;
a cover film disposed on the first surface of the insulating film; and
a connecting element disposed on a second surface of the insulating film and having a recessed combining part.

10. The printed circuit board assembly of claim 1, further comprising:
a second cover layer facing the first cover layer and covering the insulating layer, and
wherein the first cover layer covers the first conductive lines.

11. A display apparatus comprising:
a display panel configured to display an image;
a driver connected to the display panel and configured to provide a driving signal to the display panel; and
a printed circuit board assembly including a printed circuit board and a flexible cable, the printed circuit board including: a plurality of first conductive lines; an insulating layer disposed on the first conductive lines; and a first cover layer disposed on the insulating layer,
wherein the first conductive lines are connected to the driver and configured to transmit a control signal to the driver, and the first conductive lines are insulated from each other,
wherein the insulating layer has a recess disposed at a side surface of the insulating layer, the recess exposes the first conductive lines, and opposing sides of the recess are formed by the insulating layer and the first cover layer, and
wherein the flexible cable includes a plurality of second conductive lines corresponding to the first conductive lines, wherein the flexible cable is disposed in the recess.

12. The display apparatus of claim 11, wherein the flexible cable further comprises:
an insulating film, wherein the second conductive lines are disposed on a first surface of the insulating film;
a cover film disposed on the first surface of the insulating film; and
a guide line disposed on a second surface of the insulating film.

13. The display apparatus of claim 12, wherein the guide line extends in a longitudinal direction of the recess.

14. The display apparatus of claim 13, wherein the guide line includes a color ink or a color tape.

15. The display apparatus of claim 12, wherein the printed circuit board assembly further includes an adhesive disposed on the insulating film, wherein the adhesive includes a two-sided tape.

16. The display apparatus of claim 11, wherein the flexible cable further comprises:
an insulating film, wherein the second conductive lines are disposed on a first surface of the insulating film;
a cover film disposed on the first surface of the insulating film;
a handling element disposed on a second surface of the insulating film and protruded from the insulating film; and
a guide line disposed on the handling element.

17. The display apparatus of claim 16, wherein the guide line extends in a longitudinal direction of the recess.

18. The display apparatus of claim 11, wherein the insulating layer has an embossed combining part disposed in the recess, wherein the embossed combing part has a sawtooth shape.

19. The display apparatus of claim 18, wherein the flexible cable further comprises:
an insulating film, wherein the second conductive lines are disposed on a first surface of the insulating film;
a cover film disposed on the first surface of the insulating film; and
a connecting element disposed on a second surface of the insulating film and having a recessed combining part.

20. The display apparatus of claim 11, wherein the printed circuit board assembly further includes:
a second cover layer facing the first cover layer and covering the insulating layer, and
wherein the first cover layer covers the first conductive lines.

21. A printed circuit board assembly comprising:
a printed circuit board including a plurality of first conductive lines separated from each other, an insulating layer overlapping the first conductive lines, a first cover layer disposed on a first surface of the insulating layer, a second cover layer disposed on a second surface, opposite the first surface, of the insulating layer and an opening between the first cover layer and the insulating layer, wherein the opening exposes the first conductive lines and only one of the first cover layer or the second cover layer; and
a flexible cable disposed in the opening and including a plurality of second conductive lines connected to the first conductive lines.

22. The printed circuit board assembly of claim 21, wherein the flexible cable further comprises:
an insulating film;
a cover film; and
a guide line, wherein the second conductive lines are disposed between the insulating film and the cover film.

23. The printed circuit board assembly of claim 22, wherein the insulating film is disposed inside the opening, and the cover film is prevented from being positioned inside the opening by the guide line.

24. The printed circuit board assembly of claim 21, wherein the first cover layer is partially exposed by the opening, and the second cover layer covers the second surface of the insulating layer.

* * * * *